United States Patent
Seidel et al.

(10) Patent No.: US 8,694,929 B2
(45) Date of Patent: Apr. 8, 2014

(54) METHOD AND APPARATUS FOR THE POSITION DETERMINATION OF STRUCTURES ON A MASK FOR MICROLITHOGRAPHY

(75) Inventors: Dirk Seidel, Jena (DE); Michael Arnz, Oberkochen (DE)

(73) Assignees: Carl Zeiss SMT GmbH, Oberkochen (DE); Carl Zeiss SMS GmbH, Jena (DE)

( * ) Notice: Subject to any disclaimer, the term of this patent is extended or adjusted under 35 U.S.C. 154(b) by 0 days.

(21) Appl. No.: 13/543,083

(22) Filed: Jul. 6, 2012

(65) Prior Publication Data
US 2013/0019212 A1 Jan. 17, 2013

Related U.S. Application Data

(60) Provisional application No. 61/506,741, filed on Jul. 12, 2011.

(30) Foreign Application Priority Data

Jul. 12, 2011 (DE) .......................... 10 2011 078 999

(51) Int. Cl.
G06F 17/50 (2006.01)
G06F 19/00 (2011.01)
G03F 1/00 (2012.01)
G21K 5/00 (2006.01)
G06K 9/00 (2006.01)

(52) U.S. Cl.
CPC ................................ *G06F 17/5009* (2013.01); *G06F 17/5081* (2013.01); *G06F 19/00* (2013.01); *G03F 1/00* (2013.01); *G21K 5/00* (2013.01); *G06K 9/00* (2013.01)

USPC ................... 716/54; 716/53; 716/55; 700/98; 700/109; 700/120; 700/121; 430/5; 378/35; 382/145; 382/154

(58) Field of Classification Search
CPC . G06F 17/5009; G06F 17/5081; G06F 19/00; G03F 1/00; G21K 5/00; G06K 9/00
USPC .......... 716/54, 53, 55; 700/98, 109, 120, 121; 430/5; 378/35; 382/145, 154
See application file for complete search history.

(56) References Cited

U.S. PATENT DOCUMENTS 7,941,232 B2 * 5/2011 Ishii et al. ........................ 700/29
2003/0219154 A1 * 11/2003 Medvedeva et al. .......... 382/144

(Continued)

FOREIGN PATENT DOCUMENTS

DE 10 2005 023 736 11/2006 ............. G01B 11/02
DE 10 2005 051 824 5/2007 ................ G03F 7/20

(Continued)

OTHER PUBLICATIONS

Cho, Korean Patent Document No. KR 2008090794 A, published Oct. 9, 2008, abstract and drawing only, 3 pages.*

(Continued)

*Primary Examiner* — Phallaka Kik
(74) *Attorney, Agent, or Firm* — Fish & Richardson P.C.

(57) ABSTRACT

A method and an apparatus for determining the position of a structure on a mask for microlithography, in which the position is determined by comparing an aerial image, measured by a recording device, of a portion of the mask with an aerial image determined by simulation. The position determination includes carrying out a plurality of such comparisons which differ from one another with regard to the input parameters of the simulation.

16 Claims, 3 Drawing Sheets

(56) References Cited

U.S. PATENT DOCUMENTS

| | | | |
|---|---|---|---|
| 2006/0114453 A1 | 6/2006 | Goldenshtein et al. | |
| 2006/0236295 A1* | 10/2006 | Baba-Ali | 716/19 |
| 2006/0273266 A1* | 12/2006 | Preil et al. | 250/548 |
| 2007/0032896 A1* | 2/2007 | Ye et al. | 700/108 |
| 2007/0061773 A1* | 3/2007 | Ye et al. | 716/21 |
| 2008/0205743 A1* | 8/2008 | Huang et al. | 382/144 |
| 2008/0247632 A1* | 10/2008 | Boehm et al. | 382/144 |
| 2008/0288912 A1* | 11/2008 | Kim et al. | 716/19 |
| 2010/0104128 A1 | 4/2010 | Arnz et al. | |
| 2010/0208935 A1 | 8/2010 | Arnz et al. | 382/100 |
| 2010/0254591 A1* | 10/2010 | Scherubl et al. | 382/144 |
| 2011/0016437 A1* | 1/2011 | Scherubl et al. | 716/52 |
| 2011/0090329 A1 | 4/2011 | Poortinga et al. | |
| 2012/0063666 A1* | 3/2012 | Arnz et al. | 382/144 |
| 2012/0075456 A1* | 3/2012 | Seitz | 348/79 |

FOREIGN PATENT DOCUMENTS

| | | | | |
|---|---|---|---|---|
| DE | 600 36 443 | 6/2008 | | G03F 7/20 |
| DE | 102006059431 | 6/2008 | | G03F 7/20 |
| DE | 102007033815 | 11/2008 | | G03F 9/00 |
| DE | 10 2008 015 631 | 9/2009 | | G01M 11/02 |
| DE | 10 2009 016 952 | 10/2010 | | G03F 1/00 |
| DE | 10 2009 038 558 | 3/2011 | | G03F 7/20 |
| EP | 1 093 017 | 9/2007 | | G03F 7/20 |
| WO | 2011/012265 | 2/2011 | | G03F 1/00 |

OTHER PUBLICATIONS

M. Arnz et al., "Monte-Carlo Simulations of Image Analysis for flexible and high-resolution Registration Metrology", *Proceedings of EMLC 2009* (Dresden, Germany) (2009).

Harry J. Levinson, "Principles of Lithography", $2^{nd}$ edition, SPIE Press, pp. 324-330 (2005).

D. Seidel et al., "Improving registration metrology by correlation methods based on alias-free image simulation", *Proc. SPIE* 7823 (2010).

German Office Action for Application Serial No. 10 2011 078 999.5 dated Feb. 15, 2012.

* cited by examiner

METHOD AND APPARATUS FOR THE POSITION DETERMINATION OF STRUCTURES ON A MASK FOR MICROLITHOGRAPHY

CROSS REFERENCE TO RELATED APPLICATIONS

This application claims priority to U.S. provisional patent application 61/506,741, filed on Jul. 12, 2011, and German patent application 10 2011 078 999.5, filed on Jul. 12, 2011. The above applications are incorporated by reference.

DESCRIPTION

The invention relates to a method and an apparatus for the position determination of structures on a mask for microlithography.

Microlithography is used for producing microstructured components, such as, for example, integrated circuits or LCDs. The microlithography process is carried out in a so-called projection exposure apparatus having an illumination device and a projection lens. The image of a mask (also referred to as a reticle) illuminated by means of the illumination device is in this case projected by means of the projection lens onto a substrate (e.g., a silicon wafer) coated with a light-sensitive layer (e.g., photoresist) and arranged in the image plane of the projection lens, in order to transfer the mask structure to the light-sensitive coating of the substrate.

A characterization of the structures on the mask is performed both with regard to present deviations of the respective structure on the mask from the desired position predefined by the design (so-called positioning error or "registration error", or simply referred to as "registration") and with regard to the line width of the structures (e.g., critical dimension (CD)). For this purpose, by means of a position measuring apparatus, a first aerial image of an excerpt of the mask can be recorded and compared with a simulated second aerial image, whereupon the positioning error is then set to be equal to the distance between the measured first and the simulated second aerial image. When determining the second aerial image by simulation, effects within the optical beam path of the position measuring apparatus (e.g., on account of the numerical aperture of the position measuring apparatus, proximity effects, etc.) are taken into account.

Even though this method, by virtue of taking account of effects in the optical beam path, makes it possible to increase the accuracy relative to a comparison of the measured aerial image with a (direct) design image of the mask, in practice the problem can occur that, owing to the influence of parameters of the mask which, in the case of the above method, are left out of consideration and also are generally not known (for instance thickness information or else material characteristic figures of the mask), and optical parameters of the position measuring apparatus that are likewise not known, depending on the application, the position determination accuracy to be demanded is not achieved.

With regard to the prior art, reference is made, merely by way of example, to WO 2011/012265 A1, DE 10 2007 033 815 A1 and DE 10 2006 059 431 A1.

The present invention provides a method and an apparatus for the position determination of structures on a mask for microlithography which make it possible to further increase the accuracy in the position determination.

In a method according to the invention, for the position determination of structures on a mask for microlithography, the position determination is effected on the basis of the comparison of an aerial image—measured by means of a recording device—of an excerpt of the mask with an aerial image determined by simulation.

The method is characterized in that the position determination comprises carrying out a plurality of such comparisons which differ from one another with regard to the input parameters of the simulation.

The invention is based on the concept, in particular, of not proceeding from a single "fixed" simulation result, but rather carrying out as it were a "free simulation" in so far as a plurality of simulations on the basis of different input parameters are carried out, which in turn allows an approximation to the actual conditions in the position measuring apparatus. As a result, this makes it possible to achieve both a better determination of the optical parameters of the measuring apparatus (or of the optical system present for generating the measured aerial image) and a higher accuracy of the determination of the positioning error.

According to the invention, in this case the aerial image used for the comparison with the measured aerial image is still generated by an optical simulation, but the aerial images which are respectively used for the image comparison and are generated by simulation are varied by variation of the input parameters on which the respective simulation is based. In other words, the invention deliberately abandons the concept of a comparison with a single or fixed simulated image in order to determine for which of a plurality of aerial images respectively generated by simulation the image comparison is optimal, that is to say when the best correspondence between aerial image generated by simulation and measured aerial image arises. The set of input parameters corresponding to said optimum image comparison is then adopted as the (initially unknown) set of mask parameters or parameters of the position measuring apparatus.

In accordance with one embodiment, the input parameters of the simulation comprise mask parameters based on the three-dimensional extent of the mask, in particular layer thicknesses, etching angles, sidewall angles, undercuts and complex material refractive indexes.

In accordance with one embodiment, the input parameters of the simulation comprise optical parameters of an optical system present for generating the measured aerial image in the recording device, in particular the set illumination setting, the numerical aperture, the imaging scale, the wavelength, the partial coherence of the illumination, image aberrations (such as, e.g., coma or astigmatism), the pupil apodization, and/or the field uniformity. By virtue of the fact that the "free parameters" which are used as input parameters of the simulation and are likewise optimized in the course of the method include not only mask parameters but also properties of the optical system of the position measuring apparatus (that is to say of the "measuring tool") such as, for instance, the parameters mentioned above, it is possible to counteract corruption on account of the circumstance that the stated parameters likewise influence the result ultimately obtained, since the image comparison becomes independent of these parameters (which then, after all, influence both the simulation and the measurement and, consequently, "drop out" again during the structure comparison to be carried out).

In accordance with one embodiment, the input parameters of the simulation comprise the positioning error of a structure of the mask. In this case, it should be taken into consideration that said positioning error is reduced further and further when carrying out a plurality of comparisons according to the invention, since the mask design is as it were continually "shifted" and, consequently, the image comparison is increasingly improved or optimized until the optimized mask parameters and the optimized optical parameters of the position measuring apparatus are finally obtained. In order to determine the actual or total positioning error despite this shifting or constant reduction of the positioning error, another, final calculation of the positioning error on the basis of an image comparison of the measured aerial image with the aerial image now simulated on the basis of the optimized parameters of mask and position measuring apparatus is effected as it were "in conclusion".

The invention is not restricted to the (combined) variation of the mask parameters and of the parameters of the position measuring apparatus (or parameters of the optical system present for generating the measured aerial image in the recording device of the position measuring apparatus, "tool parameters"), such that, if appropriate, only mask parameters or only parameters of the position measuring apparatus or of the optical system thereof are also varied as free parameters in the course of the method.

In accordance with one embodiment, the input parameters of the simulation comprise the line width of a structure of the mask.

In accordance with one embodiment, carrying out a plurality of such comparisons is effected by way of an iteration, wherein a position difference between measured aerial image and aerial image determined by simulation, which position difference is determined during a comparison for a structure, is in each case chosen as input parameter of a subsequent simulation.

In accordance with this approach, therefore, firstly for the comparison with the aerial image measured by means of the recording device, an aerial image generated by simulation is used and a position difference determined during this comparison in the first iteration step is used as input parameter for a renewed simulation, that is to say that a simulation "slightly offset" with respect to the position of the structures on the mask is now carried out. During this renewed simulation, a better correspondence now arises for two different reasons: firstly because said position is now better known, but secondly also because the optical simulation is concomitantly adapted at the same time, or an approximation to the unknown optical parameters or the parameters of the optical system present for generating the measured aerial image in the recording device is effected. By virtue of the fact that now, in addition to the position of the structures on the mask, said optical parameters are concomitantly adapted, this in turn results in an (if appropriate slightly) different position offset, which can be used as input parameter in a further iteration step for a renewed simulation, etc.

According to the invention, therefore, a single "fixed" simulation result is not taken as a basis, rather as it were a "free simulation" is carried out which increasingly approximates to the actual conditions in the position measuring apparatus, by means of said simulation being adapted—iteratively in the present approach.

In other words, the invention includes the concept, in particular, of simultaneously concomitantly determining the mask parameters, which initially are generally still unknown, and the optical parameters of the optical system present for generating the measured aerial image in the recording device by means of the image comparison between the measured aerial image and the aerial image determined by simulation, by means of said unknown parameters on which the respective simulation is based being adopted as free parameters and the quality of the image comparison being optimized or the deviation with respect to the measurement image being minimized, from which the initially open or free parameters of the mask and of the position measuring apparatus then arise in a self-consistent manner as a result of the optimization or minimization.

The principle of so-called "model-based imaging" is basically realized by the approach described above, in the case of which principle, on the basis of a comparison between measurement images and images simulated in a parameter-dependent manner, the relevant parameters which were actually present during the measurement are deduced, wherein the difference between measurement image and simulated image is minimized as a function of the free parameters. The invention is now also distinguished, in particular, by the fact that this principle is used for a—highly accurate—position determination, specifically by virtue of treating the positioning error, to be determined according to the invention, of structures on the mask—as it were as "position inaccuracy parameter"—as one of the relevant free parameters. The principle of model-based imaging is therefore realized in such a way that the positioning error sought can be concomitantly determined as position difference between design image and measurement image simultaneously and with high accuracy.

The invention is not restricted to the above-described procedure of iteration. In accordance with a further embodiment, carrying out a plurality of comparisons of an aerial image measured by means of a recording device with an aerial image determined by simulation can also be effected on the basis of a database from a plurality of different aerial images, each determined by simulation. In this case, therefore, it is possible beforehand to carry out simulations for a multiplicity of possible input parameters and to set up a corresponding database of simulation results, whereupon all the simulation results are then compared with the aerial image measured by means of the position measuring apparatus. Analogously to the above approach, this embodiment then involves determining for which of the aerial images respectively generated by simulation the image comparison is optimal, that is to say when the best correspondence between aerial image generated by simulation and measured aerial image arises. The set of input parameters corresponding to the optimum image comparison can once again be adopted as the (initially unknown) set of mask parameters or parameters of the position measuring apparatus.

In accordance with one embodiment, the simulation is carried out as a rigorous simulation. Such a rigorous electromagnetic simulation involves describing the diffraction of the light field at the mask taking account of the three-dimensionality of the mask, wherein, in particular, the three-dimensional geometry (in particular in the form of the abovementioned mask parameters) and the concrete layer structure of the mask are taken into account. Furthermore, polarization effects (which can be described by Jones matrixes) of the mask and of the optical imaging in the position measuring apparatus are also taken into account.

Carrying out the simulations as rigorous simulations has the advantage of a significantly higher accuracy in comparison, for instance, with so-called Kirchhoff simulation (=scalar approximation), which disregards all effects associated with the three-dimensionality of the mask and which becomes increasingly erroneous in particular for structures of the order of magnitude of the optical wavelength or in the case of polarization effects. In this respect, investigations carried out on the part of the inventors have revealed that, for instance for a mask structure in the form of a double line, the error obtained upon application of Kirchhoff simulation relative to the rigorous simulation in the position determination, depending on illumination setting and depending on the distance between the lines (pitch), can be of an order of magnitude of up to 4 nm, for example, which can no longer be afforded tolerance. Furthermore, customary uncertainties both with regard to the parameters of the position measuring apparatus or of the optical system and with regard to the mask parameters can produce positioning errors of the order of magnitude of 1 nm or more, which, under certain circumstances, can no longer be afforded tolerance.

By contrast, on account of carrying out rigorous simulations according to the invention, the positions of the mask structures to be simulated and also the line widths (CDs) of said structures can be reproduced significantly more accurately. In this case, the invention makes use of the fact that the problem associated, in principle, with the realization of a rigorous simulation, namely the absence of the exact knowledge of the above-mentioned mask parameters and of the likewise abovementioned optical parameters of the position measuring apparatus, by virtue of the approach described above, in which said parameters are treated as free parameters in a plurality of different simulations together with the positioning error—which is to be determined and is likewise unknown—and are thus concomitantly determined in the course of the method, is avoided or concomitantly solved at the same time.

In other words, the possibility afforded by the invention of applying the rigorous simulation (which is otherwise rejected owing to lack of knowledge of the required parameters) is used for increasing the accuracy during the position determination.

In accordance with one embodiment, the rigorous simulation is carried out by means of the finite elements method (FEM). This has the advantage that it is possible to avoid an undesirable discretization, or discretization unsuitable in the context of the method according to the invention, of the simulated region on the mask (for instance in the form of a raster having limited pixel resolution). Thus, for instance in the case of measurement accuracies of below 0.5 nm and typical image fields of approximately 25*25 µm, an unrealistically fine discretization of pixilated design images would be necessary, which is no longer practicable owing to the long computation time.

The invention furthermore relates to an apparatus for the position determination of structures on a mask for microlithography, comprising
  a recording device for generating a measured aerial image of a portion of the mask; and
  an evaluation device, which is configured to carry out a comparison of said measured aerial image with an aerial image determined by simulation, and to carry out the position determination of structures on the mask on the basis of said comparison;
wherein
  the evaluation device is configured:
    to carry out a plurality of comparisons of the measured aerial image with an aerial image determined by simulation, wherein said comparisons differ from one another with regard to the input parameters of the simulation; and
    to carry out the position determination of structures on the mask on the basis of said plurality of comparisons.

The evaluation device can be configured, in particular, to carry out a method according to the invention comprising the features described above.

With regard to advantages and preferred embodiments of the apparatus, reference is made to the above explanations in connection with the method according to the invention.

Further embodiments of the invention are provided in the following description.

The invention is explained in greater detail below on the basis of exemplary embodiments illustrated in the enclosed figures.

Hereafter, firstly an embodiment of the method according to the invention is explained in which, in an iteration, a position difference determined during the comparison between a measured aerial image and an aerial image determined by simulation for a structure on the mask is chosen as input parameter of a subsequent simulation.

Figure 3:
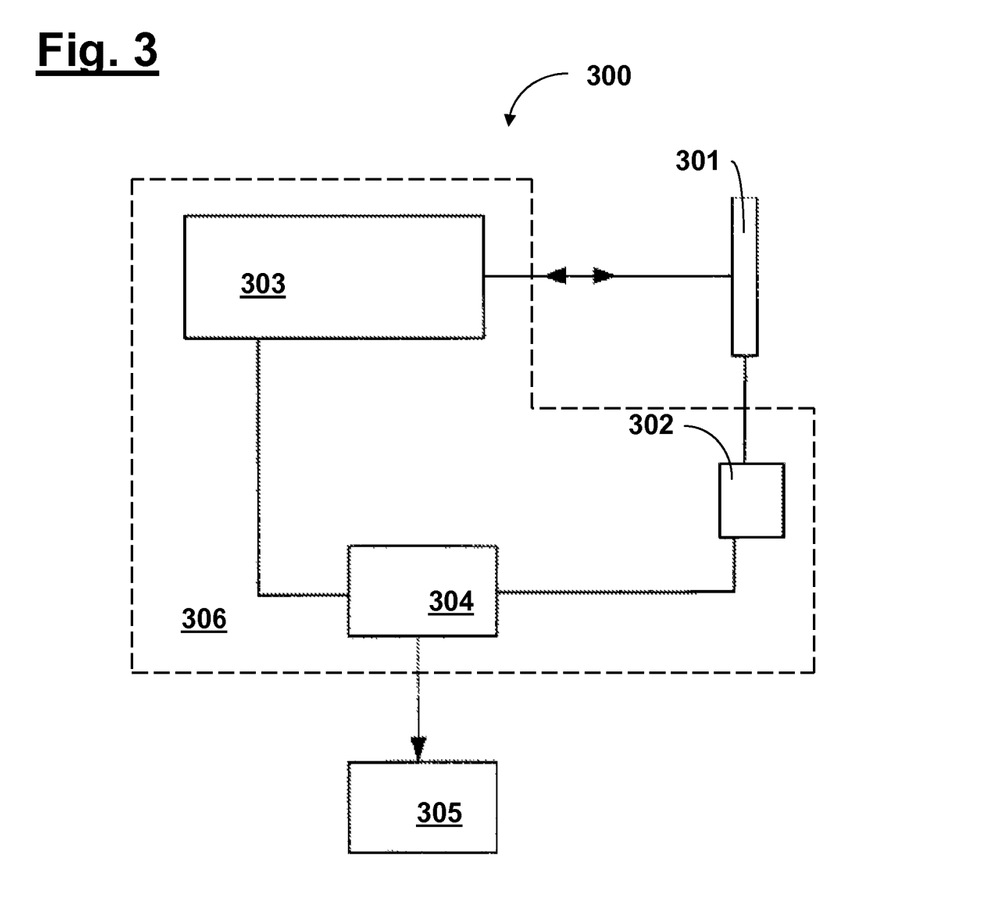
FIG. 3 shows a schematic illustration of a position measuring apparatus which can be used in the method according to the invention.

The construction of a position measuring apparatus suitable for determining the measured aerial image is illustrated merely schematically in FIG. 3. The position measuring apparatus 300 in accordance with FIG. 3 comprises a recording device 306 having a positioning device 302 serving for setting the position of a lithography mask 301, an optical system 303, by means of which excerpts of the lithography mask 301 can be recorded in enlarged fashion, and also a control device 304. The position measuring apparatus 300 in accordance with FIG. 3 furthermore comprises an evaluation device 305. The image data of the recordings generated by means of the recording device 306 are fed to the control device 304, which forwards the data to the evaluation device 305.

The sequence of the method according to the invention is explained below on the basis of a preferred embodiment with reference to the flowchart shown in FIG. 1.

Figure 1:
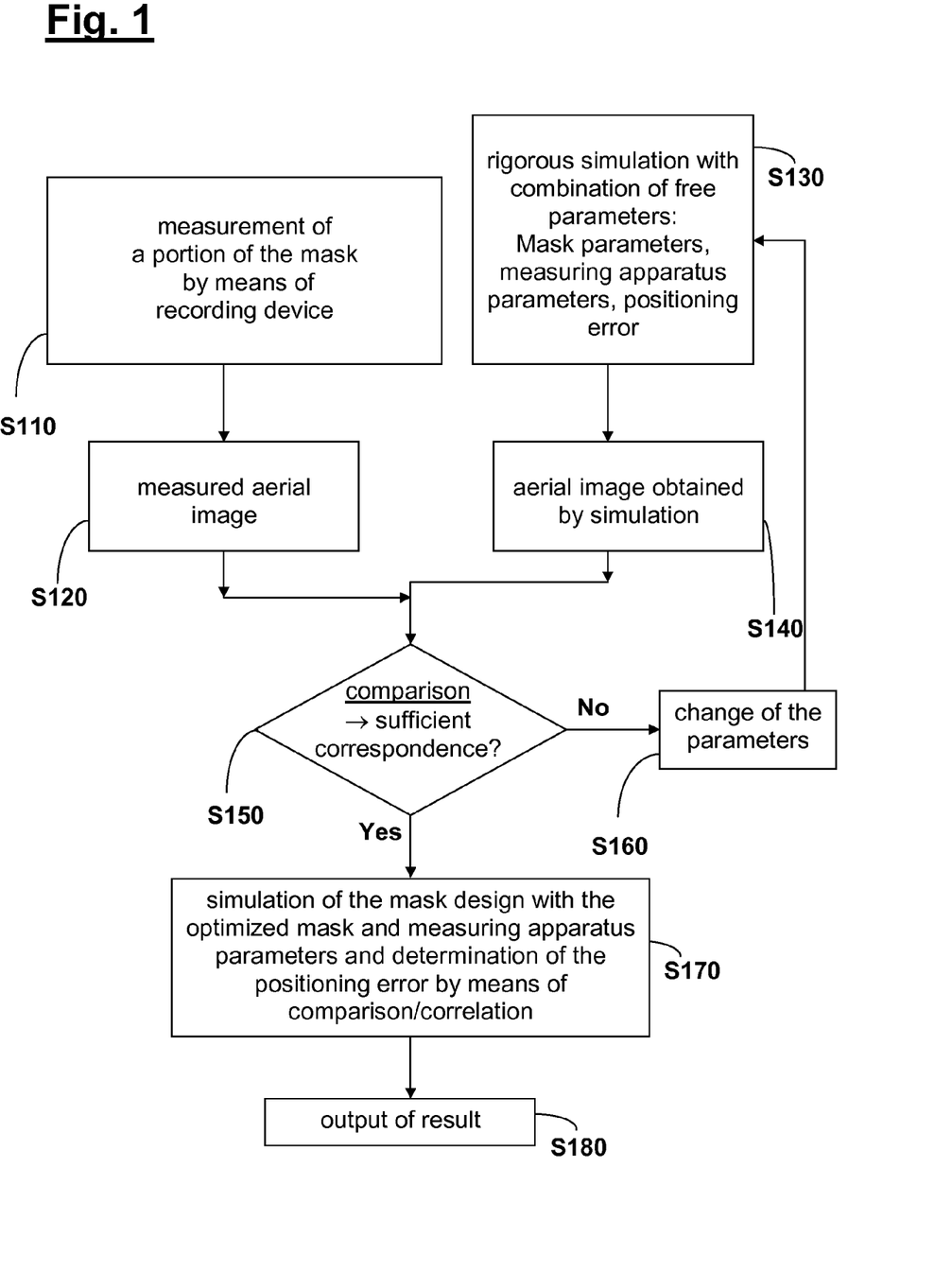
FIG. 1 shows a schematic illustration for elucidating the method according to the invention in one embodiment.

In accordance with FIG. 1, in a step S110, a portion of the mask is measured in a manner known per se by means of a recording device of a position measuring apparatus, e.g., in accordance with FIG. 3, whereupon a corresponding measured aerial image is output (step S120).

Furthermore, by way of a rigorous simulation (step S130), a simulated aerial image is obtained and output (step S140), wherein properties of the mask that are still unknown and, in particular, are based on the three-dimensional extent of the mask (e.g., in particular layer thicknesses, etching angles, sidewall angles, undercuts and complex material refractive indexes) and optical parameters of the optical system 303 of the position measuring apparatus (e.g., in particular set illumination setting, numerical aperture, imaging scale, wavelength, partial coherence of the illumination, image aberrations such as, e.g., coma or astigmatism, pupil apodization, field uniformity) together with the positioning error, ultimately to be determined, of the structure on the mask 301 are chosen as free parameters for this simulation.

The result of the comparison carried out in step S150 between measured aerial image and simulated aerial image either leads in the case of sufficient correspondence (e.g., on the basis of a threshold value criterion) to a transition to step S170 explained below, or, in the case of still inadequate correspondence, is taken as a reason for changing the above-mentioned free parameters (step S160), wherein, in the last-mentioned case, a renewed simulation in accordance with step S130 is carried out with the new parameter values that are now already better adapted, etc.

In the case of sufficient correspondence during the comparison in accordance with step S150, another, final calculation of the positioning error is effected in step S170 by way of carrying out anew the image comparison of the measured aerial image with the aerial image simulated rigorously on the basis of the now optimized parameters of mask and position measuring apparatus. This takes account of the circumstance that when carrying out a plurality of image comparisons according to the invention, the positioning error between the simulation and measurement is, after all, reduced further and further, since the mask design is as it were continually "shifted" and the image comparison is improved or optimized further and further until, finally, the optimized mask parameters and the optimized optical parameters of the optical system 303 of the position measuring apparatus are obtained. In order to determine the actual positioning error, therefore, in conclusion another calculation is carried out taking as a basis the now optimized or actual parameters of the mask and of the position measuring apparatus. In step S180, the positioning error thus obtained and the optimized mask parameters and the optimized parameters of the position measuring apparatus are then output as the result.

These now optimized mask parameters and the optimized parameters of the position measuring apparatus can now also be taken as a basis for determining the positioning error of a further structure of the mask from the outset.

In accordance with the embodiment described above, the invention includes algorithmically an iterative method. Possible examples of the minimization function which can be used in the image comparison between measured aerial image and aerial image determined by simulation are mentioned below. In this case, the free parameters present in the respective minimization function contain, in particular, the mask parameters, which are generally still unknown, and the likewise unknown parameters of the position measuring apparatus, the values of which are then ultimately likewise obtained as a result of the minimization.

Hereinafter, the aerial image (present in pixel coordinates (i,j) measured by means of the position measuring apparatus is designated by $M^{ij}$ and the aerial image or reference image determined by simulation is designated by $R_{ij}$. The unknown parameters which are implicitly contained in the measurement image and which are intended to be determined by the comparison shall be given by a vector $\vec{P}_{unknown}$ containing an arbitrary combination of mask parameters and parameters of the position measuring apparatus and the positioning error ("Registration"). In this example, there are N unknown parameters, represented as $p_1, p_2, \ldots, p_N$.

The aerial image or reference image determined by simulation is a function of these parameters, that is to say that the following holds true:

$$R^{ij} = R^{ij}(\vec{p}_{unknown}) \quad (1)$$

Furthermore, both measurement image and simulated reference image can be dependent on various known measurement settings, such as, for example, defoci D, structure types S, illumination settings B, etc. The determination of the unknown parameters can now take place by various methods:

1) By means of a minimization of the square of the image difference between measurement image and reference image, wherein optionally it is possible to effect summing over possible measurement settings D, S, B, etc.:

$$M_1(\vec{p}_{unknown}) = \sum_{D,S,B,\ldots} \sum_{ij} \left(M^{ij}_{D,S,B,\ldots} - R^{ij}_{D,S,B,\ldots}(\vec{p}_{unknown})\right)^2 = \min_{\vec{p}_{unknown}}! \quad (2)$$

Here, the "min!" or "max!" notation means that the preceding formula or term is to be minimized or maximized, respectively.

Since the measurement image is not dependent on the parameters of the minimization, this can be written as $$M_1(\vec{p}_{unknown}) = \sum_{D,S,B,\ldots} \sum_{ij} \left([R^{ij}_{D,S,B,\ldots}(\vec{p}_{unknown})]^2 - 2 \cdot M^{ij}_{D,S,B,\ldots} \cdot R^{ij}_{D,S,B,\ldots}(\vec{p}_{unknown})\right) = \min_{\vec{p}_{unknown}}! \quad (3)$$

The solution with respect to the N unknown parameters generally leads to a non-linear equation system $$\frac{\partial M_1(\vec{p}_{unknown})}{\partial p_1} = 0, \ldots, \frac{\partial M_1(\vec{p}_{unknown})}{\partial p_N} = 0. \quad (4)$$

This can either be linearized under the assumption that the parameters sought deviate only little from suitable start values $\vec{p}_0$, $\vec{p}_{unknown} = \vec{p}_0 + \vec{\epsilon}$, or be solved directly by suitable, known methods, such as, e.g., nested intervals, secant methods or Newton-Raphson methods [cf. "Numerical Recipes in C. The Art of Scientific Computing", 2nd Edition, 1992, ISBN 0-521-43108-5].

2) By the use of a so-called "keyhole" correlation, in which the difference only within a specific area $$\left(\text{defined by a normalized mask } K^{ij} \text{ with the condition } \sum_{ij} K^{ij} = 1\right)$$

is evaluated:

$$M_2(\vec{p}_{unknown}) = \sum_{D,S,B,\ldots} \sum_{ij} \left(M^{ij}_{D,S,B,\ldots} - R^{ij}_{D,S,B,\ldots}(\vec{p}_{unknown})\right)^2 K^{ij} = \min_{\vec{p}_{unknown}}! \quad (5)$$

The solution with respect to the unknown parameters is effected analogously to case 1).

The unknown parameters can also be determined by other forms of the keyhole correlation, as disclosed in WO 2011/012265 A1.

3) By the evaluation of a classical, normalized cross-correlation (maximization) between measurement image and reference image:

$$\sum_{D,S,B,\ldots} \frac{\sum_{ij} \left(M^{ij}_{D,S,B,\ldots} \cdot R^{ij}_{D,S,B,\ldots}(\vec{p}_{unknown})\right)}{\sqrt{\sum_{ij} (M^{ij}_{D,S,B})^2} \sqrt{\sum_{ij} (R^{ij}_{D,S,B}(\vec{p}_{unknown}))^2}} = \min_{\vec{p}_{unknown}}! \quad (6)$$

The solution with respect to the unknown parameters again leads to a non-linear equation system and is effected analogously to case 1).

Although examples for the determination of the unknown parameters have been mentioned above, the invention is not restricted thereto; rather, in principle, it is also possible to apply any form of image comparison in a manner dependent on unknown parameters.

The stated forms of minimization/maximization can be solved by partial derivatives with respect to all the unknown parameters. This yields an equation system in the undetermined parameters, which can be solved by known methods of linear algebra.

Figure 2:
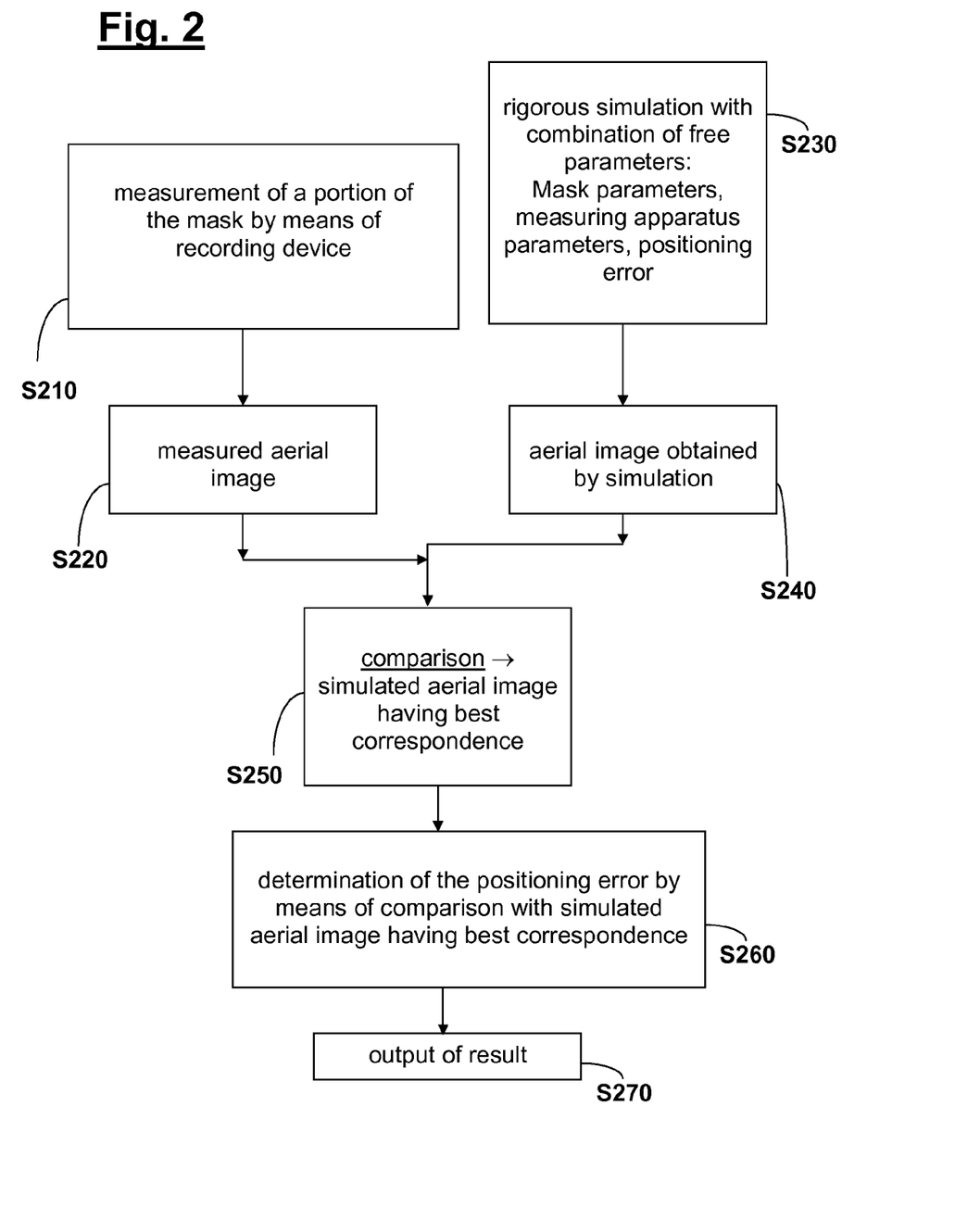
FIG. 2 shows a schematic illustration for elucidating the method according to the invention in a further embodiment.

In accordance with a further embodiment, illustrated in the diagram in FIG. 2, carrying out a plurality of comparisons of the measured aerial image with the aerial image determined by simulation is not effected iteratively, but rather on the basis of a database base from a plurality of different aerial images, each determined by simulation beforehand.

In accordance with FIG. 2, firstly analogously to the embodiment described with reference to FIG. 1, in a step S210, a portion of the mask is measured by means of a recording device, whereupon a corresponding measured aerial image is output (step S220). In contrast to FIG. 1, step S230 furthermore involves carrying out a plurality of simulations for different combinations of input parameters, wherein the aerial images respectively obtained are stored in a corresponding database of simulation results (step S240). The simulated aerial image with the best correspondence is then selected (step S250), and the set of input parameters which is obtained in this case and which corresponds to the optimum image comparison is in turn adopted as the (initially unknown) set of mask parameters or parameters of the optical system of the position measuring apparatus. In a concluding step S260, analogously to the method in accordance with FIG. 1, a renewed, as it were final determination of the entire positioning error is then effected on the basis of a comparison or the correlation with said aerial image having the best correspondence, whereupon, in step S270, the positioning error thus obtained and the optimized mask parameters and the optimized parameters of the position measuring apparatus are then output as the result.

The features described above related to processing of data, e.g., according to one or more of equations (1) to (6), can be implemented in digital electronic circuitry, or in computer hardware, firmware, software, or in combinations of them. The features can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. Alternatively or in addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

The described features related to processing of data can be implemented advantageously in one or more computer programs that are executable on a programmable system including at least one programmable processor coupled to receive data and instructions from, and to transmit data and instructions to, a data storage system, an input device, and an output device. A computer program is a set of instructions that can be used, directly or indirectly, in a computer to perform a certain activity or bring about a certain result. A computer program can be written in any form of programming language (e.g., Fortran, C, C++, Objective-C, Java), including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors or cores, of any kind of computer. For example, the evaluation device 305 may include one or more such processors that execute instructions for implementing a process for determining the positions of structures on a lithography mask. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a LCD (liquid crystal display) monitor, an electronic ink (E-ink) display, or an organic light emitting diode (OLED) display for displaying information to the user and a keyboard and a pointing device such as a mouse, a trackball, or touchpad by which the user can provide input to the computer. A touch display can also be used in which the display surface is sensitive to touch inputs from a user.

Even though the invention has been described on the basis of specific embodiments, numerous variations and alternative embodiments are apparent to the person skilled in the art, e.g., through combination and/or exchange of features of individual embodiments. For example, elements of one or more implementations may be combined, deleted, modified, or supplemented to form further implementations. As yet another example, the logic flows of processes described above do not require the particular order shown, or sequential order, to achieve desirable results. In addition, other steps may be provided, or steps may be eliminated, from the described flows, and other components may be added to, or removed from, the described systems.

For example, in some implementations, the position measuring apparatus 300 may have several possible measurement settings (e.g., defoci D, structure types S, and illumination settings B) that are known. The process shown in FIG. 1 can be modified such that in step S110, for each possible measurement setting, the position measuring apparatus 300 measures an aerial image of the portion of the mask 301 having the structure whose position is to be determined. This results in a set of measured aerial images of the mask 301.

Step S130 can be modified such that for each possible measurement setting, the position measuring apparatus 300 generates a simulated aerial image of the portion of the mask 301 having the structure whose position is to be determined. When simulating this first set of aerial images, suitable start values are used for the unknown parameters. The start values can be appropriately selected based on typical values for mask parameters (such as thickness) and tool parameters. Thus, a first set of simulated aerial images is generated using the start values for the unknown parameters.

Step S150 can be modified such that the set of measured aerial images is compared with the first set of simulated aerial images to determine if a similarity threshold is met. The difference between the set of measured aerial images and the first set of simulated images can be determined based on, e.g., a sum of the square of the image difference between each measured image and a corresponding simulated image (the measured and simulated images being based on the same measurement settings). This is similar to the difference formula in equation (2). The similarity threshold is met if the difference is below a threshold value.

If the similarity threshold is not met, the process loops back to step S130, and a second set of simulated aerial images of the mask is generated using a different set of values for the unknown parameters. The set of measured aerial images is compared to the second set of simulated aerial images to determine if the similarity threshold is met, and if the similarity threshold is not met, a third set of simulated aerial image of the mask is generated, and so forth. If the similarity threshold is met, the values used for the unknown parameters for the last simulation are selected as the optimized values for the unknown parameters. The difference between the position of the structure on the measured aerial image for a particular set of measurement settings, and the position of the corresponding structure on the simulated aerial image generated using the optimized values for the unknown parameters is determined. This difference represents the position error (or deviation from the desired position) of the structure.

Similar modifications can be made to the process in FIG. 2.

In some implementations, constraints for one or more of the unknown parameters can be provided during the minimization or maximization process according equations (2), (3), (5), and (6).

Accordingly, such variations and alternative embodiments are concomitantly encompassed by the present invention, and the scope of the invention is defined by the accompanying patent claims and the equivalents thereof.

What is claimed is:

1. A method for determining a position of structures on a mask for microlithography, wherein the position determination is effected on a basis of a comparison of an aerial image, measured by a recording device, of a portion of the mask with an aerial image determined by simulation, the method comprising:

measuring an aerial image of a portion of a mask for microlithography, the portion of the mask having structures;

performing a plurality of simulations of aerial images of the portion of the mask based on different input parameters; and determining, using a computer, the position of the structures by carrying out a plurality of comparisons between the measured aerial image and the simulated aerial images, wherein the comparisons differ from one another with regard to the input parameters of each respective simulation;

wherein varied input parameters of the simulation comprise at least one of mask parameters based on three-dimensional extent of the mask or optical parameters of an optical system for generating the measured aerial image in the recording device; said method further comprising the following steps:

determining a set of input parameters for which an associated comparison of the plurality of comparisons yields the best correspondence;

determining a further aerial image by simulation on a basis of said set of parameters;

carrying out a comparison of this further simulated aerial image with the measured aerial image; and determining a positioning error of a structure of the mask on a basis of said comparison.

2. The method according to claim 1, wherein carrying out the plurality of comparisons is effected by an iteration process, in which a position difference between a structure in the measured aerial image and a corresponding structure in the aerial image determined by simulation is in each case chosen as an input parameter of a subsequent simulation.

3. The method according to claim 1, wherein carrying out the plurality of comparisons is effected on a basis of a database from a plurality of different aerial images determined by simulation, by beforehand carrying out simulations for a multiplicity of possible input parameters and setting up a corresponding database of simulation results, whereupon the simulation results are then compared with the measured aerial image.

4. The method according to claim 1, wherein the simulation is carried out as a rigorous simulation, taking into account of three-dimensional geometry and a concrete layer structure of the mask.

5. The method according to claim 4, wherein said rigorous simulation is carried out by a finite elements method.

6. The method according to claim 1, wherein the input parameters of said each respective simulation comprise at least one of layer thicknesses, etching angles, sidewall angles, undercuts, or complex material refractive indexes.

7. The method according to claim 1, wherein the input parameters of said each respective simulation comprise at least one of set illumination setting, numerical aperture, imaging scale, wavelength, partial coherence of the illumination, image aberrations, pupil apodization, or field uniformity.

8. The method according to claim 1, wherein the input parameters of said each respective simulation comprise a line width of a structure of the mask.

9. An apparatus for a position determination of structures on a mask for microlithography, comprising:

a recording device for generating a measured aerial image of a portion of the mask; and an evaluation device, which is configured to:

carry out a plurality of comparisons of the measured aerial image with aerial images determined by simulation, wherein said comparisons differ from one another with regard to input parameters for each simulation, and carry out the position determination of structures on the mask on a basis of said plurality of comparisons;

wherein varied input parameters of said each simulation comprise at least one of mask parameters based on three-dimensional extent of the mask or optical parameters of an optical system present for generating the measured aerial image in the recording device;

wherein the evaluation device is configured to further perform:

determining a set of input parameters for which an associated comparison of the plurality of comparisons yields the best correspondence;

determining a further aerial image by simulation on a basis of said set of parameters;

carrying out a comparison of this further simulated aerial image with the measured aerial image; and determining a positioning error of a structure of the mask on a basis of said comparison.

10. The apparatus according to claim 9, wherein the evaluation device is configured to carry out the plurality of comparisons by an iteration process, in which a position difference between a structure in the measured aerial image and a corresponding structure in the aerial image determined by simulation is in each case chosen as an input parameter of a subsequent simulation.

11. The apparatus according to claim 9, wherein the evaluation device is configured to carry out the plurality of comparisons on a basis of a database from a plurality of different aerial images determined by simulation, by beforehand carrying out simulations for a multiplicity of possible input parameters and setting up a corresponding database of simulation results, whereupon the simulation results are then compared with the measured aerial image.

12. The apparatus according to claim 9, wherein the evaluation device is configured to carry out the simulation as a rigorous simulation, taking into account of three-dimensional geometry and a concrete layer structure of the mask.

13. The apparatus according to claim 12, wherein the rigorous simulation is carried out by a finite elements method.

14. The apparatus according to claim 9, wherein the input parameters of said each simulation comprise at least one of layer thicknesses, etching angles, sidewall angles, undercuts, or complex material refractive indexes.

15. The apparatus according to claim 9, wherein the input parameters of said each simulation comprise at least one of set illumination setting, numerical aperture, imaging scale, wavelength, partial coherence of the illumination, image aberrations, pupil apodization, or field uniformity.

16. The apparatus according to claim 9, wherein the input parameters of said each simulation comprise a line width of a structure of the mask.

* * * * *